United States Patent [19]

Kitagawa et al.

[11] Patent Number: 4,789,781
[45] Date of Patent: Dec. 6, 1988

[54] SCANNING ELECTRON MICROSCOPE

[75] Inventors: Masaki Kitagawa, Chiba; Akira Ohtomo, Kanagawa; Teruo Fujimoto, Kawasaki, all of Japan

[73] Assignee: Director-General of Agency of Industrial Science and Technology, Tokyo, Japan

[21] Appl. No.: 26,315

[22] Filed: Mar. 16, 1987

[30] Foreign Application Priority Data

Aug. 29, 1986 [JP] Japan .................... 61-201348

[51] Int. Cl.$^4$ ............................................. G01N 23/22
[52] U.S. Cl. ................................ 250/310; 250/443.1; 250/305
[58] Field of Search ................ 250/310, 443.1, 309, 250/306, 305

[56] References Cited

U.S. PATENT DOCUMENTS 4,464,571  8/1984  Plies ................................. 250/305
4,683,376  7/1987  Feuerbaum ....................... 250/310

OTHER PUBLICATIONS

Instron Catalog by Instro-Japan Co., Ltd., JC-D-21-(a)/Apr., 1982.

Primary Examiner—Carolyn E. Fields
Assistant Examiner—John A. Miller
Attorney, Agent, or Firm—Cushman, Darby & Cushman

[57] ABSTRACT

A scanning electron microscope includes a heater coil which is arranged around a sample, an electron beam which is radiated when the sample is heated, and a secondary electron generated from the sample which is attracted to a photo multiplier. In this electron microscope, a shield plate is provided having an extracting hole for extracting the secondary electron outside of the heat coil in such a manner that the extracting hole is aligned with a light axis of the electron beam. The shield plate is connected to a power source which supplies a variable voltage so that a desired voltage can be applied to the shield plate so as to shield thermal electrons.

5 Claims, 3 Drawing Sheets

SCANNING ELECTRON MICROSCOPE

BACKGROUND OF THE INVENTION

1. Field of the Invention

The present invention relates to an electron microscope which observes the micro-action of a fracture or deformation of materials such as metal, ceramics, etc. More precisely, it relates to an improved electron microscope by which a sample at a temperature higher than 800° C. can be observed.

2. Description of the Related Arts

In the conventional scanning electron microscope, an electron beam is radiated on the sample, and then secondary electrons are generated from the sample which are attracted to a photo multiplier, and via a photo multiplier tube, displayed on a screen of a cathode ray tube.

In the above-mentioned conventional electron microscope, the resolution at a high temperature is poor. This reduction of resolution is considered to occur because, in addition to the secondary electrons generated from the sample to be observed, thermal electrons are also generated from the sample or the heater coil and combine with the secondary electrons to cause a disturbance of the cathode ray tube image. Also, a disturbance is caused when the heater coils are wound in the same direction. Particularly, this phenomenon is greatly enlarged when the sample is heated above 800° C., seriously affecting the reliability of the data obtained.

SUMMARY OF THE INVENTION

An object of the present invention is to provide an electron microscope for observation a sample under high temperature conditions.

Another object of the present invention is to provide an electron microscope having a high data accuracy and reliability.

According to the present invention, the electron microscope includes a heater coil which is arranged around a sample, an electron beam which is radiated when the sample is heated, and a secondary electron beam generated from the sample which is attracted to a photo multiplier. In this electron microscope, a shield plate having an extracting hole for extracting the secondary electrons outside of the heat coil is provided in such a manner that the extracting hole is aligned with an axis of the electron beam. The shield plate is connected to a power source supplying a variable voltage so that a desired voltage can be applied to the shield plate.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1:
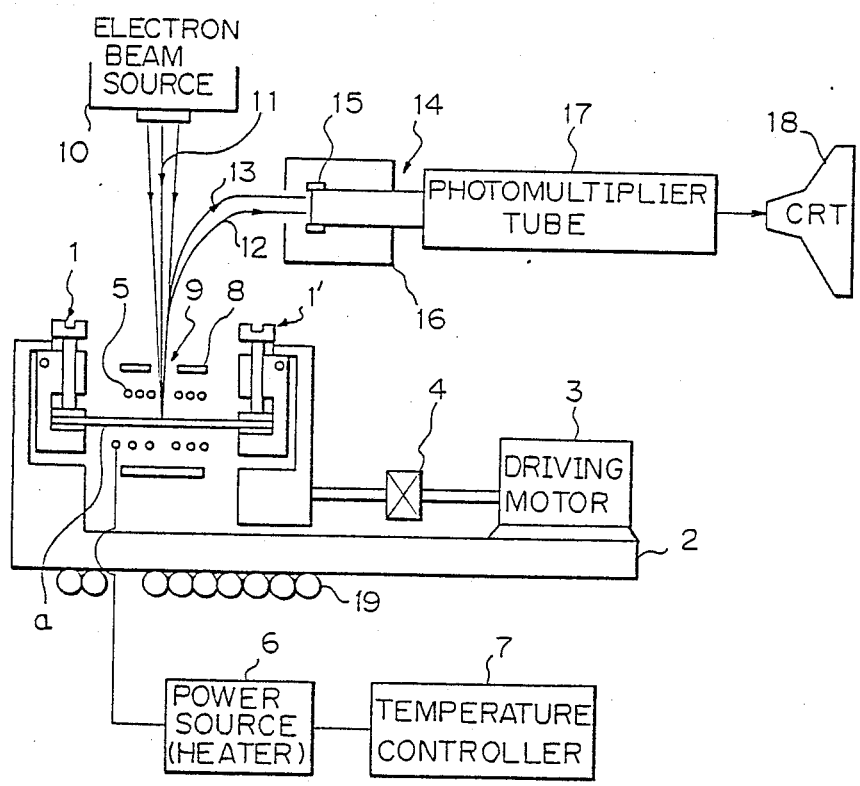
FIG. 1 is a schematic diagram of a conventional electron microscope.

FIG. 1 shows a schematic diagram of a conventional scanning electron microscope in which a microscopic action is displayed on a screen of a cathode ray tube when a sample is heated to a certain temperature, and further, subjected to a bending load.

In FIG. 1, a sample a is supported by supporting members 1, 1' at both ends. The supporting members 1, 1' are rotably supported on a bed 2 by pins (not shown), and a driving motor 3 is connected to the supporting members 1, 1' via a load meter 4 so that a desired bending load is applied to the sample a.

Further, a heater coil 5 is provided around the sample a, and a power source 6 for the heater and a temperature controller 7 are connected to the heater coil 5, whereby the sample a is heated to a predetermined temperature.

The heater coil 5 is surrounded by a circular heat reflecting plate 8 having an extracting hole 9 formed therein. The extracting hole 9 acts as a path for introducing a primary electron beam 11 radiated from an electron beam source 10 of the electron microscope, and as an extracting path for a secondary electron beam 12 generated from the sample a. When an electron beam 11 having a voltage of about 5 ~ 30 kV is radiated to the sample a, a secondary electron 12 of about 10 eV is generated from the sample a, and further, when the heater coil 5 is heated to about 800° ~ 1200° C., a thermal electron beam 13 of about 2 eV is generated.

The secondary electron beam 12 and thermal electron beam 13 rapidly move to the exterior through the extracting hole 9. Then, since a high voltage is applied to an electrode 15 provided at a photo-multiplier 14, the secondary electron 12 and thermal electron 13 are attracted, as shown by the arrows in FIG. 1, and introduced via a window provided in a light shielding plate 16 to a photo multiplier tube 17, and after signal processing, are displayed on a screen of the cathode ray tube (CRT) 18.

Further, in FIG. 1, 19 designates a water pipe for cooling.

In the above mentioned conventional electron microscope, the resolution at a high temperature is poor, and the reduction of resolution is considered to occur because in addition to the secondary electron beam 12 generated beam from the sample a to be observed, the thermal electron beam 13 is generated from the sample a or the heater coil 5 is combined with the secondary electron beam 12 to cause a disturbance, and is then displayed on the screen. Also, a disturbance occurs because the heater coils 5 are wound in the same direction. In particular, when the sample a is heated above 800° C., this phenomena becomes great, and thus the reliability of the data is seriously impaired.

The gist of the present invention is that, of the electrons which can be passed through the extracting hole of the shielding plate, only the secondary electrons generated from the sample are allowed to pass therethrough, so that the passage of the thermal electrons and the resultant exterior disturbance is prevented.

Concretely, when the electron beam of about 5 ~ 30 kV is radiated to the sample a, a secondary electrons having a high energy level of about 10 eV (negative voltage) are generated, and when the sample a is heated by the heater coil to about 900° ~ 1200° C., thermal electrons having a relatively low energy level of about 3 eV (negative voltage) are generated from the heater coil or the sample.

In the present invention, a voltage which is high enough not to affect the secondary electrons but low enough to reject the thermal electrons is applied to the shield plate, to form an electron field. The electric field is formed near the extracting hole by applying a voltage of about 5 V (negative voltage), so that the rapid escape of the thermal electron having a low energy level through the extracting hole is restricted.

Here, when the voltage of the secondary electron is shown as $E_1$, the voltage of the shield plate is shown as $E_2$ and the voltage of the thermal electron is shown as $E_3$; therefore, the relationship of the following equation is satisfied: that is, $$E_1 > E_2 > E_3 \qquad (1)$$

wherein, the values in the equation (1) are shown by absolute values.

As can be seen from the above, only the necessary secondary electrons for the photo multiplier are selected and can reach thereto.

Figure 2:
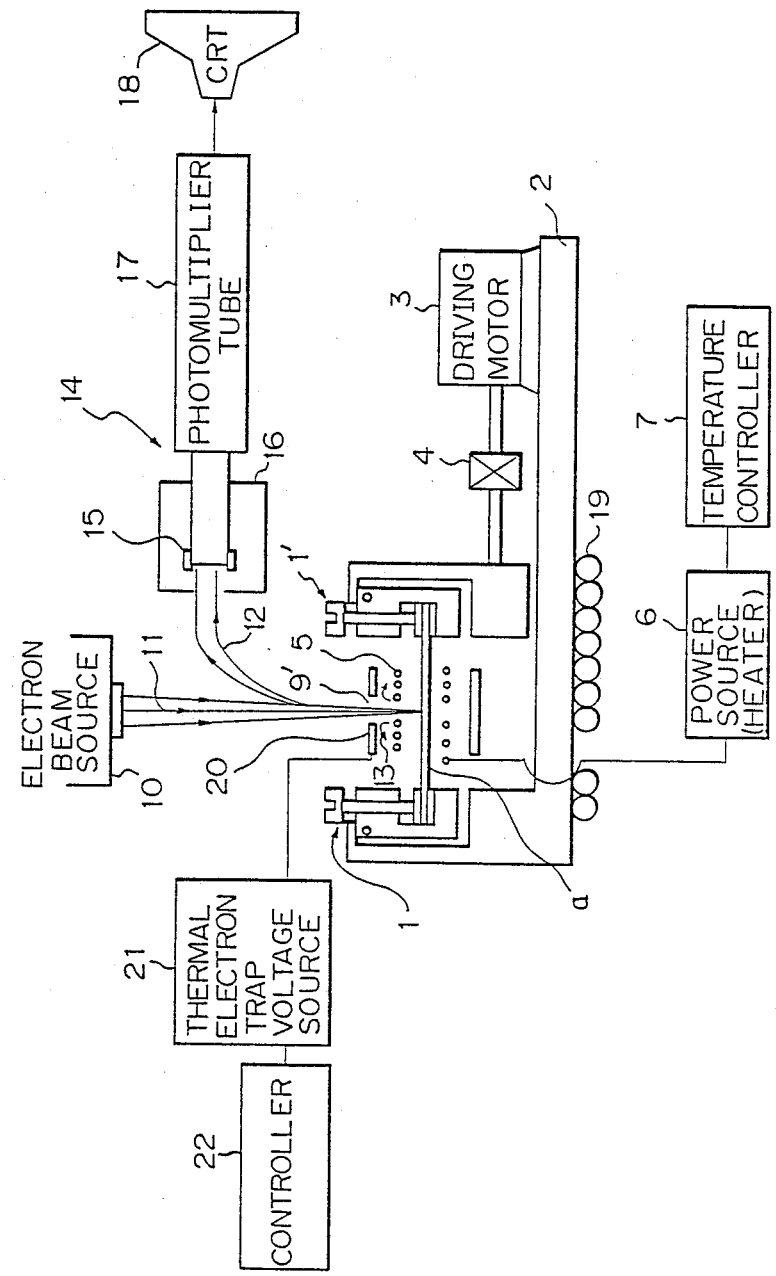
FIG. 2 is a schematic diagram of an electron microscope according to the present invention.
Figure 3:
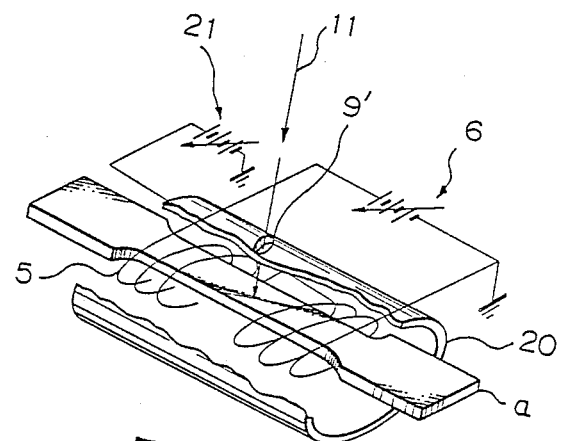
FIG. 3 is a diagram showing a first embodiment of the present invention.
Figure 4:
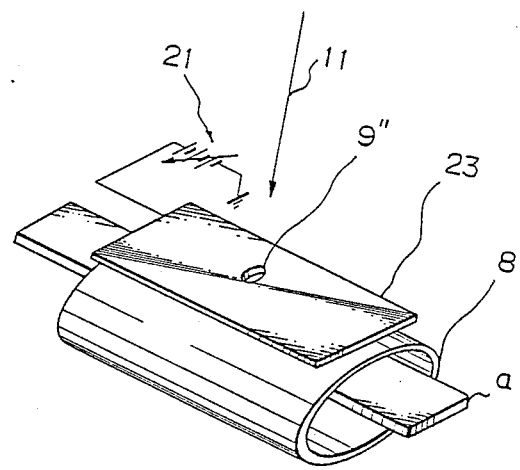
FIG. 4 is a diagram showing a second embodiment of the present invention.

FIG. 2 is a schematic view explaining a first embodiment of the present invention; FIG. 3 is a diagram showing an enlarged essential portion of the diagram shown in FIG. 2; and, FIG. 4 is a diagram showing an essential portion of a second embodiment of the present invention.

In FIG. 2, reference numerals 1 to 19 denote the same elements as in FIG. 1.

In FIG. 2, the sample a is supported by supporting members 1, 1' at both ends, and further, the supporting members 1, 1' are rotably supported on the bed 2 by pins (not shown), and the driving motor 3 is connected to the supporting member via the load meter 4 so that the desired bending load is applied to the sample a. Further, the heater coil 5 is provided around the sample a, and the power source 6 for the heater and a temperature controller 7 are connected to the heater coil 5, whereby the sample a is heated to a predetermined temperature.

The heater coil 5 is surrounded by a heat shielding plate 20 having an extracting hole 9' provided therein, and also connected to a thermal electron trap voltage source 21 and a voltage controller 22, so that a desired voltage can be supplied to the shielding plate 20. An electron beam 11, which is radiated from the electron beam source 10 of the electron microscope, passes through the extracting hole 9' and generates the secondary electron 12 on the sample a.

Further, the thermal electrons 13 are generated by heating the heater coil 5, but the rapid escape of the thermal electrons 13 through the extracting hole 9' of the shield plate 20 is prevented. Only the secondary electrons 12 escape to the exterior, and are attracted to the electrode 15 provided on the photo multiplier 14 by the voltage applied to the electrode 15, as shown by the arrows. Then, the secondary electrons 12 pass through the window of the light shield plate 16 and the photo multiplier tube 17, and are displayed on the screen of the CRT 18.

The first embodiment of the present invention will be explained by referring to FIG. 3.

The sample a is surrounded by the heater coil 5, which is connected to the power source 6 for the direct current heater, and the voltage of the power source 6 is variable, to allow an adjustment for a desired temperature. Further, the coil is non-inductionarily wound, that is, as shown in FIG. 3, the left half of the coil and the right half of the coil are inversely wound to each other to decrease any disturbance of the electron beam 11 by the magnetic field generated by the heater coil.

Outside of the heater coil 5, the shield plate 20 having a cylindrical form is provided, and the extracting hole 9' is provided in the shield plate 20. The extracting hole 9' is aligned with the light axis of the electron beam 11. The shield plate 20 is connected to a direct current power source 21 for the thermal electron trap, and the voltage of the power source 21 is variable that it can be set at a predetermined voltage.

Accordingly, the power source 21 can be adjusted to an energy level which is lower than that of the secondary electrons generated from the sample a by being radiated from the electron beam, and which is higher than that of the thermal electrons generated from the heater coil and the sample a. Therefore, only the secondary electrons are allowed to pass through the extracting hole 9', and the passage of the thermal electrons is prevented.

Note, a conventional heat reflecting plate formed of an electric conductive material and insulated from the other portion may be usable as the shield plate 20.

FIG. 4 shows a second embodiment of the present invention. In FIG. 4, a heater coil (not shown in the drawing) is provided surrounding the sample a. Further, a heat reflecting plate 8 is provided, and a shield plate 23 having a planar form is provided outside of the heat reflecting plate 8 in such a manner that the extracting hole 9" is aligned with the light axis of the electron beam 11. Here, the power source connected to the shield plate 23 is not explained because it is similar to the case shown in FIG. 3.

Further, in the second embodiment, the shield plate 23 having a planar form is provided outside of the heat reflecting plate 8, but a circular shield plate can be used instead.

As is believed to be clear from the above explanation, the present invention has the following effects:

a. The sample can be observed when heated to a temperature higher than 800° C.

b. An excellent resolution can be obtained over a wide temperature range.

c. The data reliability is high.

We claim:

1. An electron microscope comprising:
    a heater coil arranged around a sample for heating said sample,
    an electron source for radiating an electron beam when said sample is heated,
    a photo multiplier tube to which secondary electrons generated from said sample are attracted,
    a power source for supplying a variable voltage, and
    a shield member having an extracting hole for extracting said secondary electrons outside of said heater coil in such a manner that said extracting hole is aligned with a light axis of said electron beam, said shield member being connected to said power source which supplies a variable voltage so as to apply a desired voltage to said shield member,
    wherein said heater coil is wound in such a manner that a heater coil on the left of the axis of said electron beam and a heater coil on the right of the axis of said electron beam are wound in an inverse direction.

2. An electron microscope according to claim 1, wherein said power source comprises means for applying a value of said desired voltage which is lower than a voltage value of secondary electrons generated from said sample being radiated with said electron beam and higher than a voltage value of thermal electrons generated from said heater coil and said sample.

3. An electron microscope according to claim 1, wherein said shield member has a cylindrical form.

4. An electron microscope according to claim 3, wherein a heat reflecting member having a cylindrical form is provided between said shield member having a cylindrical form and said heater coil.

5. An electron microscope according to claim 1, wherein said shield member has a flat plate form and a heat reflecting member having a cylindrical form is provided between said shield member having a flat plate form and said heater coil.

* * * * *